United States Patent [19]

Beyer et al.

[11] Patent Number: 4,745,081

[45] Date of Patent: May 17, 1988

[54] METHOD OF TRENCH FILLING

[75] Inventors: Klaus D. Beyer, Poughkeepsie; Victor J. Silvestri, Hopewell Junction, both of N.Y.

[73] Assignee: International Business Machines Corporation, Armonk, N.Y.

[21] Appl. No.: 793,518

[22] Filed: Oct. 31, 1985

[51] Int. Cl.$^4$ .................... H01L 21/36; H01L 21/425
[52] U.S. Cl. ....................................... 437/38; 437/67; 437/78; 437/203; 437/90
[58] Field of Search ........ 357/47, 49, 55, 68, 357/23.6; 156/643, 648, 655; 148/DIG. 50; 437/67, 38, 203, 78, 225

[56] References Cited

U.S. PATENT DOCUMENTS

| | | | |
|---|---|---|---|
| 4,375,124 | 3/1983 | Gogan | 29/580 |
| 4,446,476 | 5/1984 | Isaac et al. | 357/68 |
| 4,462,040 | 7/1984 | Ho et al. | 357/55 |
| 4,470,062 | 9/1984 | Muramatsu | 357/55 |
| 4,520,552 | 6/1985 | Arnould et al. | 29/576 W |
| 4,522,662 | 6/1985 | Bradbury et al. | 156/610 |
| 4,554,728 | 11/1985 | Shepard | 357/55 |
| 4,611,386 | 9/1986 | Goto | 29/576 W |
| 4,661,202 | 4/1987 | Ochii | 29/591 |

FOREIGN PATENT DOCUMENTS

| | | | |
|---|---|---|---|
| 0108390 | 5/1984 | European Pat. Off. | 357/23.6 |
| 0116789 | 8/1984 | European Pat. Off. | 29/576 W |
| 0137647 | 10/1981 | Japan | 29/576 E |
| 0050752 | 3/1983 | Japan | 29/576 W |
| 0168233 | 10/1983 | Japan | 29/576 W |
| 0220445 | 12/1983 | Japan | 29/576 W |
| 0208750 | 11/1984 | Japan | 357/68 |

OTHER PUBLICATIONS

Wada, A Folded Capacitor Cell for Future Megabit Drams, IEDM, 1984, pp. 244-247.
"Dynamic Ram Cell with Merged Drain and Storage", IBM TDB, vol. 27, No. 11, Apr. 1985, pp. 6694-6697.
Endo, 'Novel Device Isolation Technology with Selective Epitaxial Growth', IEDM, 1982, pp. 241-244.
Rathman et al., J. Electrochem. Soc., V. 129, No. 10, (Oct., 1982), pp. 2303-2306.
Zingg et al., J. Electrochem., Soc., V. 133, p. 1274.

Primary Examiner—Olik Chaudhuri
Attorney, Agent, or Firm—Sughrue, Mion, Zinn, Macpeak, and Seas

[57] ABSTRACT

A method of simultaneously producing doped silicon filled trenches in areas where a substrate contact is to be produced and trench isolation in other areas. Borosilicate glass lines the sidewalls of those trenches where a contact is desired and undoped epitaxially grown silicon fills all the trenches. Subsequent heat processing causes the boron in the borosilicate to dope the epitaxial silicon in those trenches. In the other trenches, the silicon fill remains undoped except at the bottom where a channel stop exists, thereby forming isolation trenches. The contacts formed over the trenches may be formed by selectively deposition of a highly doped silicon into an opening that overlies a portion of the trench and the adjacent substrate surface.

28 Claims, 3 Drawing Sheets

METHOD OF TRENCH FILLING

BACKGROUND OF THE INVENTION

This invention relates to the fabrication of semiconductor integrated circuits. In particular, this invention is directed to a method of simultaneously forming electrically isolated areas and conductive contact areas in semiconductor material.

When fabricating integrated circuits, and particularly highly dense dielectrically isolated devices, narrow trenches are formed to provide isolation. Also points where substrate contact is desired must be established in very small zones. It is known that undoped polysilicon and epitaxial silicon each have very high electrical resistance. Thus, a defect in a trench sidewall or at the passivation layer on the top of a silicon trench fill will not impact the characteristics of electrical circuits if a second defect is positioned a few $\mu$m away from the first defect. Consequently, the use of undoped polysilicon trench isolation as used typically in known RAM chips is considered a very low risk isolation scheme. That is, so long as defects are disposed far enough away, the presence of an electrical short giving rise to a particular trench sidewall defect will not be detrimental to operation of that device.

The use of undoped polysilicon trench isolation also does not require the step of passivation layer removal at the trench bottom. Consequently, the trench sidewall is not exposed to etching operations such as reactive ion etching (RIE) and, therefore, does not need additional protective layers such as $Si_3N_4$ which also cause additional problems in terms of forming dislocations near trenches in subsequent heat processing steps.

While the use of undoped polysilicon trench isolation offers certain advantages, it is considered disadvantageous since there is no easy technique within that methodology for forming a silicon substrate contact. If, for example, doped polysilicon or epitaxially grown silicon is employed, the presence of one defect will cause device and circuit failure. Within the art, there is no known technique for providing a doped silicon trench area, needed to form a substrate contact in device processing, yet within the same process utilize undoped polysilicon for purposes of trench isolation.

The prior art is replete with a number of examples which illustrate the use of polysilicon as a trench filling material. Reference is made to U.S. Pat. Nos. 4,473,598; 4,140,558 and 4,252,579. Various silicon trench filling techniques to achieve isolation are also disclosed U.S. Pat. No. 4,526,631, and in IBM Technical Disclosure Bulletin Nos.: Vol. 25, No. 2, p. 558, July 1982; Vol. 25, No. 6, p. 3105, November 1982; Vol. 27, No. 2, p. 1313 et seq., July 1984; and Vol. 27, No. 3, p. 1481, Aug. 1984. While the prior art, as exemplified by these references, provides a number of solutions of providing a silicon trench fill scheme, none provide for the simultaneous formation of doped and undoped epitaxial silicon fill. Some prior art devices employ undoped silicon fill for device trench isolation but are encumbered with the problems of providing substrate contact in other areas where a doped silicon material is required. In those techniques where doped silicon material is used throughout, the problem of complete device failure given proximity of defects is unsolved. Moreover, in some devices there exists no simple process for forming the necessary silicon substrate contact. In some known devices, the wafer back cannot be employed as a silicon substrate contact given the presence of ancillary structure. Such is found in thermal conduction modules wherein the back side of the wafer is used for purposes of heat dissipation and the like.

SUMMARY OF THE INVENTION

Given the deficiencies of the prior art, this invention defines a process which employs undoped polysilicon trench isolation and doped epitaxially grown silicon simultaneously for purposes of substrate contact. In accordance with the invention, typically a borosilicate glass lining is formed on the sidewalls of the trenches in the non-device areas and epitaxially grown silicon is then grown in the trenches. Subsequent heating causes the doping of the epitaxially grown silicon with the boron dopant of the borosilicate glass. The fill temperature may also provide for dopant movement.

Moreover, in accordance with another embodiment of this invention, an undoped epitaxial fill is provided followed by doping of a polysilicon fill material and subsequent planarization by known techniques in chemical/mechanical polishing. Thus, the initial epitaxial fill may be used for substrate contact while the subsequent polysilicon (undoped) is used to provide device isolation.

Thus, in a first preferred embodiment of this invention, a monocrystalline semiconductor substrate is provided having a pattern of substantially vertical wall trenches extending from a major surface of the substrate into the substrate material. An insulator layer is formed on the walls of the trenches. A boron ion implantation is then performed to establish the channel stop layer at the bottom of the trench. A borosilicate glass layer is then formed on the walls of the isolation layer. A portion of the insulator layer is removed together with a portion of the borosilicate glass layer from the bottom by etching techniques. One technique is anisotropic etching. Then, by lithography and etching techniques, borosilicate glass layer is removed from all portions of the trenches except where electrical contact is desired. The trenches are then filled with silicon to produce a pattern of isolation trenches with undoped silicon in the trenches except where the borosilicate layer is present such that the silicon is doped to provide an electrical contact to the substrate.

In accordance with another preferred embodiment of this invention, a monocrystalline semiconductor substrate is provided having a pattern of substantially vertical wall trenches extending from a major surface of the substrate and into the substrate structure. The substrate and the trenches are lined with $SiO_2$ and boron ions are implanted into the trench bottoms for the formation of a p-doped channel stop. Then, by the application of a photoresist and a subsequent RIE step, the oxide is removed at the bottom of the trenches in those locations where silicon substrate contacts are to be formed. In those trenches where there is to be no contact, the photoresist fills and remains in the trench, thereby protecting the $SiO_2$ lining at the bottom of that trench from the RIE etching. Following the removal of the photoresist and using known techniques, epitaxial p-doped silicon is then grown in the trenches designated to be substrate contact areas to slightly overfill these trenches. An example of epitaxial growth is described in U.S. Pat. No. 4,526,631. Undoped polysilicon is then deposited in all trenches and on the substrate surface. This is followed by planarization of both the p-doped selective epitaxial filled silicon substrate contact trench and the undoped polysilicon isolation trench using known chemical/mechanical polishing techniques.

This invention will be discussed in greater detail by referring to the attached drawings and the description of the preferred embodiment that follows.

DETAILED DESCRIPTION OF THE PREFERRED EMBODIMENTS

Figure 1:
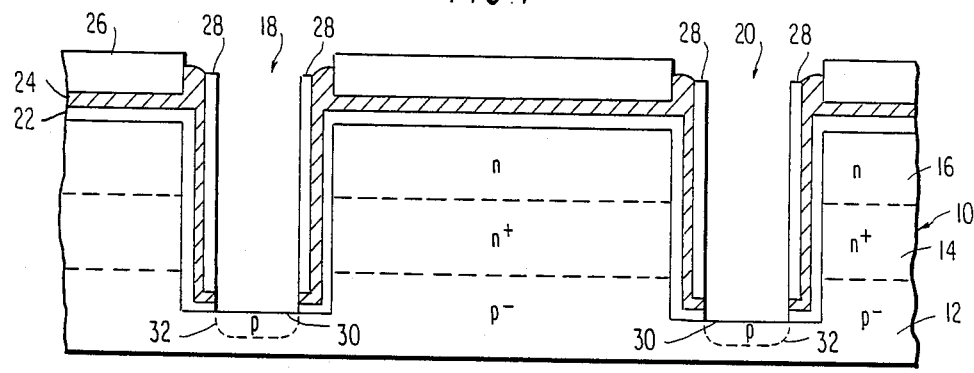
FIGS. 1 and 2 are cross-sectional views of a portion of a semiconductor wafer during various stages in the fabrication of an integrated circuit in accordance with one preferred embodiment of this invention.
Figure 2:
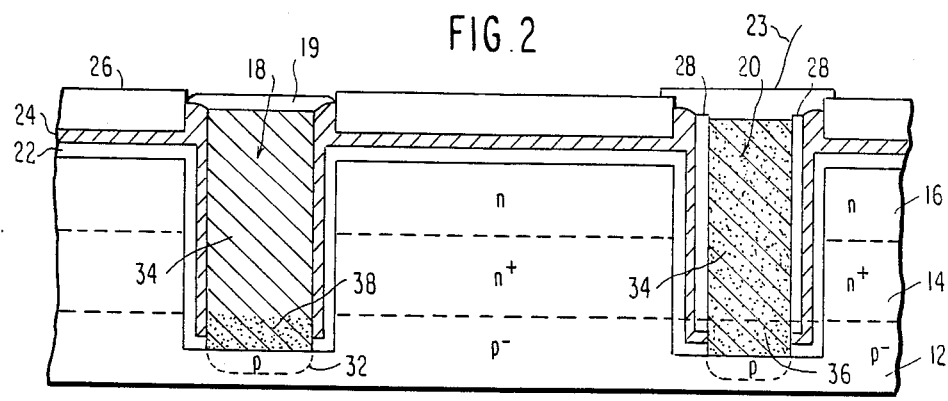
Figure 3:
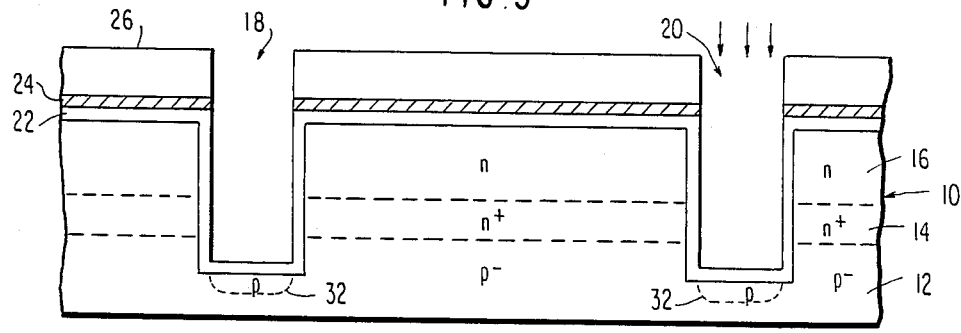
FIGS. 3-6 are cross-sectional views of a portion of a semiconductor wafer during various stages in the fabrication of an integrated circuit in accordance with a second preferred embodiment of this invention.

Referring first to FIGS. 1 and 2, a first preferred embodiment of this invention is disclosed. It is understood that in this description and in the drawings, those portions of the semiconductor structure not needed to explain this invention, or those steps which are superfluous to this invention have been eliminated. Such are well known in the art. In the first preferred embodiment of this invention, chemical vapor deposition (CVD) of borosilicate is employed to line the inside of the trench sidewall layer structure. Such is illustrated in FIG. 1.

FIG. 1 illustrates an intermediate starting point of this invention wherein the substrate 10 typically comprises a three-tier structure. A P-type substrate material 12 has an N+ region 14 which typically serves as a low-resistance contact or collector region beneath an epitaxial layer. The third tier is an N-type epitaxial layer formed over the N+ region. This layer serves as the active region for the device. It is in this three-tiered structure that the problem of electrical isolation of portions of those layers occur. This specific problem is solved by this invention.

A lining of thermal $SiO_2$ 22 covers the substrate surface in the interior walls of the trenches. On top of the thermal $SiO_2$ layer, a layer 24 of $Si_3N_4$ is deposited followed by deposition by CVD of a $SiO_2$ layer 26. In accordance with known techniques, trenches 18 and 20 are opened into the substrate.

In accordance with this invention, by CVD a borosilicate layer is formed as the inside lining of the trench sidewalls. This layer 28 is deposited in both trenches 18 and 20. By the use of techniques such as RIE, the trench bottom 30 is opened, that is, removal of layers 22, 24 and 28 at the bottom of the trench, and a channel stop layer 32 is provided.

The channel stop may be formed by a variety of known techniques. For example, it may be formed by ion implantation of the bottom surface 30, by lining the inside walls with borosilicate with a subsequent heat treatment for boron out-diffusion or by a combination of the two.

Referring now to FIG. 2, subsequent device processing steps are illustrated. As illustrated in FIG. 2, trench 20 will ultimately become a substrate contact while trench 18 will become the isolation trench. While two trenches are illustrated, it is to be understood that on the substrate 10 an array of such trenches will be present. It is also understood that trench size will vary and may be different between contact and non-contact techniques. Thus, a preferential etch step is performed to remove the borosilicate trench sidewall everywhere except for the substrate contact areas. As illustrated in FIG. 2, the borosilicate 28 remains in the trench 20 while it is removed from the sidewalls of trench 18. This is accomplished by a photoalignment step with a preferential etch to remove the borosilicate trench lining material. Such etch techniques are known in the art. Then, trenches 18 and 20 are filled completely with selectively deposited epitaxial silicon. This undoped fill material completely fills the trenches 18 and 20.

During the fill step, the boron, outdiffusing from the previously deposited borosilicate trench lining into the undoped epitaxial silicon in the substrate contact area 32 dopes the epi. However, in the trench where the borosilicate was removed prior to filling with the undoped polysilicon or epitaxial silicon fill, doping occurs only by outdiffusion of the trench channel stop boron diffusion 32 into the epitaxial silicon near the trench bottom. Consequently, as illustrated in FIG. 2, a substrate contact area 36 is created in the trench 20 since the epi is doped. In the isolation trench 18 the outdiffusion of the channel stop boron is only into the epitaxial silicon near the trench bottom. Such is shown by shallow zone 38 in FIG. 2. Consequently, by this technique a series of isolation trenches and a series of substrate contact trenches may be simultaneously formed. The structure is completed by $SiO_2$ insulation 19 above trench 18 and metal contact 23 above the contact trench 20.

In accordance with the embodiment just described, thermal $SiO_2/Si_3N_4$/CVD borosilicate is used as a trench sidewall for doping an undoped epitaxial fill. These materials form a permanent sidewall structure that reduces the probability of dislocations which are caused by subsequent heat treatment of a conventional sidewall structure. For example, this structure can be: thermal $SiO_2$ approximately 500 Å $Si_3N_4$ approximately 500 Å and CVD borosilicate approximately 4000 Å in thickness. Other relative thicknesses are within the scope of this invention. Also, other insulation layers may be used in place of this structure.

Referring now to FIGS. 3-6, a second preferred embodiment of this invention will be described. To the extent that this embodiment utilizes the same structure, it will be identified with the same numerals. Thus, the same tiered substrate structure comprising the P-layer 12, N+ layer 14 and N layer 16 are provided together with trenches 18 and 20. The thermal $SiO_2$ layer 22 and $Si_3N_4$ layer 24 with the CVD $SiO_2$ layer 26 form a common starting point as in the first preferred embodiment. Other insulation layers may be used. Also, boron ions are implanted into the trench bottoms for the formation of a p-doped channel stop 32.

Figure 4:
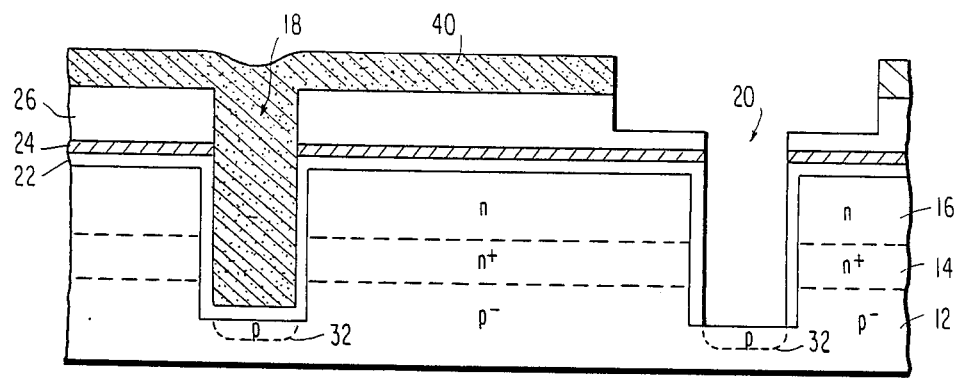

This embodiment differs from the first embodiment in that the next step is the application of a photoresist 40 completely covering the substrate surface and filling each of the trenches. Using known techniques the resist 40 is opened over trenches where contact is desired. FIG. 4 illustrates the structure after an RIE step has opened the trench bottom and removed some of the top oxide layer. Typically RIE, in a timed etch step to remove oxide from the trench 20 to form the "future" silicon substrate contact. That is, FIG. 4 illustrates a structure having trench 20 with oxide removed such that the trench is opened for contact while trench 18 remains filled with photoresist material. This timed etching also opens the area above trench 20 by selective removal of the CVD oxide 26. The photoresist 40 is then removed.

Figure 5:
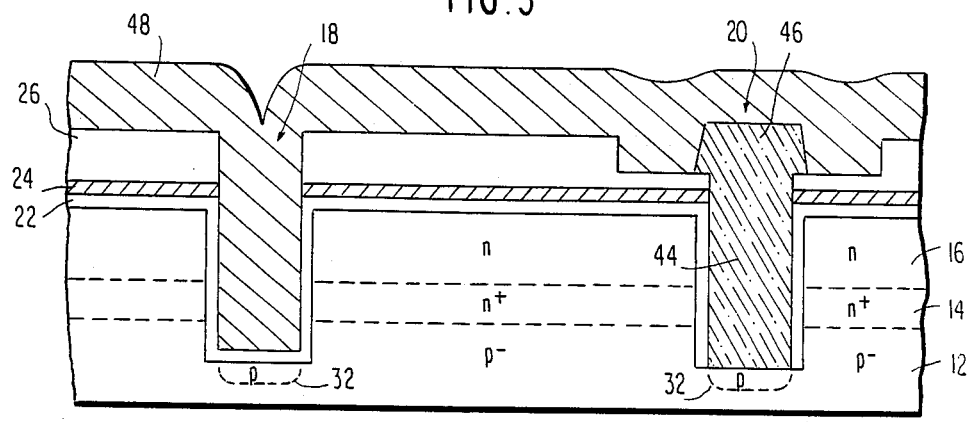

Referring now to FIG. 5, subsequent steps and the next intermediate stage of the device are illustrated. In FIG. 5, a selective epitaxial p-doped silicon zone 44 has been deposited and grown in the substrate contact trench 20. This epitaxial silicon refill can be made to slightly overfill trench 20 as illustrated. The epitaxial silicon is allowed to grow upward and outward, to completely encapsulate and seal the trench 20. Such is illustrated in FIG. 5 (structure 46). This selective growth occurs only in trenches where a substrate contact opening has been provided at the trench bottom. Application of a blanket growth of undoped polysilicon follows the selective epitaxial refill. This layer 48 completely fills the trench 18 and covers the CVD oxide layer 26. It also covers and encapsulates the dome 46 and the epitaxially grown p-doped silicon layer.

Figure 6:
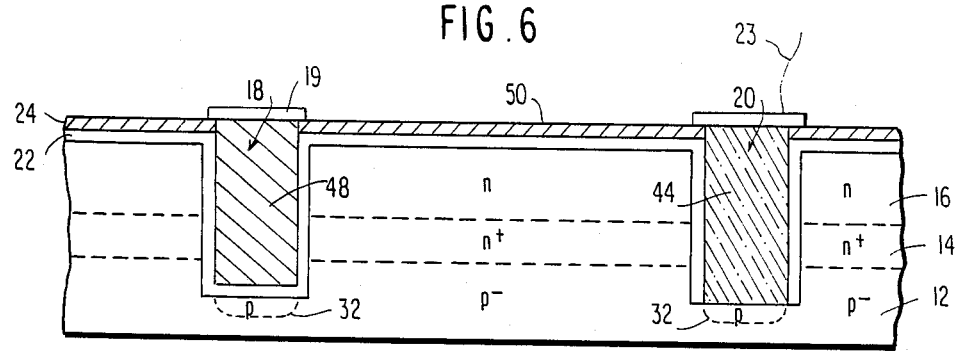

FIG. 5 illustrates that when the undoped polysilicon 48 is deposited discontinuities in planarity occur in those areas where trench filling occurs. Ridges are also formed in the vicinity of the cap 46. In order to planarize the device, both the p-doped epitaxial dome 46 and the polysilicon undoped material 48 filling the trench 18 are planarized. Thus, by chemical/mechanical polishing techniques, the CVD oxide layer is removed and the domed structure 46 is polished such that planarization of the top surface 50 of the substrate occurs. Such is illustrated in FIG. 6. The structure is completed by an $SiO_2$ layer 19 over trench 18 and a metal contact 23 over trench 20.

As can be appreciated, by this technique an isolation trench 18 is formed filled with undoped polysilicon while, as a function of simultaneous processing, a substrate contact trench 20 is formed having a p-doped epitaxial silicon deposited and grown therein.

Figure 7A:
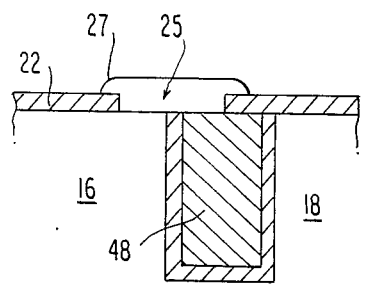
FIGS. 7A and 7B are cross-sectional views of a portion of a semiconductor and for illustrating overlapping contacts.
Figure 7B:
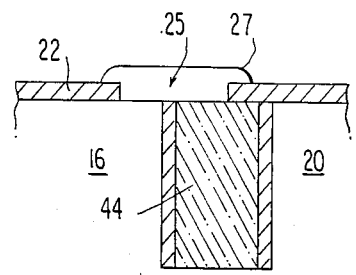

Turning now to FIGS. 7A and 7B, examples of overlapping contacts are illustrated. In the previous embodiments the $SiO_2$ cover 18 on the insulative trench 18 was centered over that trench. Likewise, the contact 23 over the substrate contact trench 20 was aligned with that trench. In accordance with this invention, the contacts may overlap the trench fill and the trench sidewall.

FIG. 7A illustrates an isolation trench having a polysilicon refilled trench 48. The insulative structure 22 is opened such that an opening 25 encompasses a portion of trench 18, its sidewall and the substrate surface. Into that opening polysilicon, epitaxial silicon or a combination is selectively deposited. By overgrowth of the trench fill and the substrate material, a contact is formed in the opening. Such structures may be used for forming contacts to trench capacitor cells as in C-MOS dynamic RAM technology.

FIG. 7B illustrates a substrate contact trench having a selectively epitaxially refilled trench 20. As in the case of the embodiment of FIG. 7A, the insulative structure is opened to partially overlie the trench 20 and a portion of the substrate. The opening 25 overlaps the doped epitaxially refilled trench 20, the insulative trench sidewall and the epi surface of the substrate. This zone is selectively filled with epitaxial silicon, polysilicon or a combination thereof. By overgrowth of the silicon filled trench and substrate material a contact is formed in the opening.

This contact structure is advantageous in that it saves space on the substrate surface and reduces the space between adjacent devices. This technique saves processing steps and allows the contacts to be precisely positioned. That is, the deposition of the highly doped material occurs precisely where the contact is desired. This technique also results in a more planar surface since the overgrowth is nearly co-planar with the overlying oxide.

This contact formation technique is not limited to the insulator structure ($SiO_2$, $Si_3N_4$) of FIGS. 1-6. The insulator may be oxide, nitride or a combination thereof. Moreover, while the contact is illustrated extending across the top of trench, it may be buried along the sidewall.

It is apparent that this invention may modified without departing from the essential scope thereof.

We claim:

1. A method of forming an integrated circuit structure having an isolation pattern and a contact pattern comprising the steps of:
   providing a semiconductor substrate having a pattern of substantially vertical-walled trenches extending downward from a major surface of said substrate;
   forming an insulator layer on the walls of said trenches;
   forming a borosilicate glass layer on said insulator layer;
   removing by anisotropic etching a portion of said insulator layer and said borosilicate glass layer from the bottom of said trenches;
   removing said borosilicate glass layer from all portions of trenches where isolation is to be established and maintaining the remaining borosilicate glass layer in trenches where electrical contact with said substrate is to be made; and
   filling all of said trenches with silicon to simultaneously produce a pattern of isolation trenches filled with undoped silicon and a pattern of substrate contacts in those trenches where the silicon is doped by the borosilicate layer.

2. The method of claim 1, further comprising the step of implanting boron into said trenches after the step of anisotropic etching to provide a channel stop layer.

3. The method of claim 1 wherein said anisotropic etching is reactive ion etching.

4. The method of claim 1 further comprising the step of placing contacts above trenches having said pattern of substrate contacts.

5. The method of claim 1 wherein said silicon filling said trenches is undoped epitaxial silicon.

6. The method of claim 1 wherein said step of providing an insulator layer comprises the steps of depositing a layer of thermal $SiO_2$ on said substrate and the major surface walls of said trenches and depositing on said $SiO_2$ layer a layer of $Si_3N_4$.

7. The method of claim 6 wherein said borosilicate layer is deposited on said insulator layer.

8. The method of claim 1 wherein the step of removing said borosilicate layer is by etching.

9. A method of forming an integrated circuit structure having an isolation pattern and a contact pattern comprising the steps of:
   providing a semiconductor substrate having a pattern of substantially vertical-walled trenches extending downward from a major surface of said substrate;
   forming an insulator layer on the walls of said trenches;

providing a channel stop at the bottom of each of said trenches;

filling said trenches with a photoresist and then selectively etching said photoresist from trenches where electrical contact with said substrate is to be made and also removing from those trenches the insulator layer at the trench bottom;

removing the remaining photoresist and growing epitaxial p-doped silicon in those trenches to be substrate contacts to fill and cover those trenches; and filling the remaining trenches with undoped polysilicon; and planarizing the major surface of said substrate to simultaneously form a pattern of substrate contact trenches and a pattern of isolation trenches.

10. The method of claim 9 wherein said step of providing a channel stop comprises the step of implanting boron into said trenches.

11. The method of claim 9 wherein the step of forming an insulator layer comprises the steps of depositing a layer of thermal $SiO_2$ on said substrate major surface and the walls of said trenches.

12. The method of claim 9 wherein the step of selectively etching said photoresist comprises a timed reactive ion etching to remove photoresist from the trench interior and insulator material from the trench bottom.

13. The method of claim 9 wherein said step of planarization comprises chemical/mechanical polishing of said substrate major surface.

14. The method of claim 13 further comprising the step of placing contacts above trenches having said pattern of substrate contacts.

15. The method of claim 14 wherein said contacts overlap said trenches and the major surface of said substrate.

16. The method of claim 1 wherein said contacts overlap said trenches and the major surface of said substrate.

17. A method of forming contacts for an integrated circuit structure comprising the steps of:

providing a semiconductor substrate having a pattern of substantially vertical-walled trenches extending downward from a major surface of said substrate and filled with silicon, forming an insulation layer on said major surface;

opening said insulative layer to define a contact zone that overlaps a sidewall of said filled trench and an adjacent portion of said substrate major surface;

selectively depositing a silicon material into said contact zone; and overgrowing said trench fill and said substrate with said silicon material into said contact zone to create a contact that overlaps said filled trench and said substrate major surface.

18. The method of claim 17 wherein said silicon material is highly doped polysilicon.

19. The method of claim 17 wherein said silicon material is highly doped epitaxial silicon.

20. The method of claim 17 wherein said silicon material is a combination of highly doped polysilicon and epitaxial silicon.

21. The method of claim 17 wherein said silicon filling said trench is polysilicon.

22. The method of claim 17 wherein said silicon filling said trench is epitaxial silicon.

23. A method of forming contacts for an integrated circuit structure comprising the steps of:

providing a semiconductor substrate having a pattern of substantially vertical-walled trenches extending downward from a major surface of said substrate and filled with silicon;

providing an insulative structure to define a contact zone that overlaps a sidewall of said filled trench and an adjacent portion of said substrate major surface;

selectively providing a silicon material in said contact zone to overgrow said trench fill and said substrate into said contact zone to create a contact that overlaps said filled trench and said substrate major surface.

24. The method of claim 23 wherein said silicon material is highly doped polysilicon.

25. The method of claim 23 wherein said silicon material is highly doped epitaxial silicon.

26. The method of claim 23 wherein said silicon material is a combination of highly doped polysilicon and epitaxial silicon.

27. The method of claim 23 wherein said silicon filling said trench is polysilicon.

28. The method of claim 23 wherein said silicon filling said trench is epitaxial silicon.

* * * * *